United States Patent [19]

Hiser et al.

[11] Patent Number: 5,401,987
[45] Date of Patent: Mar. 28, 1995

[54] SELF-CASCODING CMOS DEVICE

[75] Inventors: Douglas L. Hiser, Berkeley; Kou-Hung L. Loh, Pleasanton, both of Calif.

[73] Assignee: IMP, Inc., San Jose, Calif.

[21] Appl. No.: 160,577

[22] Filed: Dec. 1, 1993

[51] Int. Cl.$^6$ ............................................. H01L 27/02
[52] U.S. Cl. ..................................... 257/204; 257/264; 257/268; 257/269; 257/376; 257/391; 257/392; 257/657; 257/205
[58] Field of Search ............... 257/204, 264, 268, 269, 257/376, 391, 392, 657, 205, 211

[56] References Cited

U.S. PATENT DOCUMENTS 3,653,978  4/1972  Robinson et al. ................ 257/392
4,814,839  3/1989  Nishizawa et al. ............... 257/264

OTHER PUBLICATIONS

Allen, P. E. et al., "CMOS Analog Circuit Design," Holt, Rinehart and Winston, Inc., Fort Worth, pp. 413–414 (1987).
Masuda, S. et al., "CMOS Sampled Differential Push-Pull Cascode Operational Amplifier," *IEEE*, pp. 1211–1214, (1984).
Geiger, R. L. et al., "VLSI Design Techniques for Analog and Digital Circuits," *MCGraw-Hill New York*, pp. 414–427, (1990).

Primary Examiner—Edward Wojciechowicz
Attorney, Agent, or Firm—Majestic, Parsons, Siebert & Hsue

[57] ABSTRACT

A self-cascoding transconductance circuit has cascoding and current sink/source FETs, serially connected with their gates tied together to receive an input voltage, wherein the cascoding FET has a threshold voltage having an absolute value at least 0.1 volts less than that of the current sink/source FET to ensure that the current sink/source FET operates in its saturated region. A CMOS structure implementing the self-cascoding transconductance circuit has two doped threshold adjust regions formed beneath a gate electrode such that the two doped threshold adjust regions respectively effectuate the cascode and current sink/source FETs which then share the gate electrode. A method of forming the CMOS structure includes forming two self-cascoding transconductance circuits electrically connected in parallel such that they share a common drain region between their respective gate electrodes, and each has one source region. By forming the two self-cascoding transconductance circuits in such a fashion, the effect of alignment errors contributed by each of the parallel connected self-cascoding transconductance circuits is cancelled out for the combined circuit.

34 Claims, 11 Drawing Sheets

SELF-CASCODING CMOS DEVICE

BACKGROUND OF THE INVENTION

This invention relates in general to cascode amplifiers and in particular, to field-effect-transistor ("FET") cascode transconductance circuits, CMOS structures for implementing those FET cascode transconductance circuits, and methods of forming those CMOS structures.

Cascode amplifiers are useful in various circuits, because of their inherently wide bandwidths. In particular, by avoiding the Miller effect, cascode amplifiers provide superior high frequency performance over other conventional amplifier circuits that are subject to high frequency roll-off.

FIG. 1A illustrates, as an example, a conventional, cascode transconductance circuit 10 comprising n-mos FETs, 12 and 14, serially connected together such that the source of n-mos FET 14 (also referred to herein as the "cascoding transistor") is connected to the drain of n-mos FET 12 (also referred to herein as the "current sinking transistor"). A first voltage V1 is then connected at node D to the source of n-mos FET 12, a second voltage V2 is connected at node A to the drain of n-mos FET 14, a bias voltage Vcasc is connected at node B to the gate of n-mos FET 14, and an input voltage Vin is connected at node C to the gate of n-mos FET 12. The second voltage V2 is selected to be greater than the first voltage V1, and the bias voltage Vcasc is selected to be sufficient to ensure that n-mos FET 12 operates in its saturated region. Thereupon, when an input voltage Vin is applied to the gate of n-mos FET 12, a proportional output current Iout flows through n-mos FETs 12 and 14.

FIGS. 1B and 1C illustrate, as examples, two conventional CMOS structures, 20 and 40, respectively, for implementing the conventional cascode transconductance circuit 10 in an integrated circuit. CMOS structure 20 uses a shared n+ source/drain region 23 to provide a more compact structure (i.e., requiring less surface die area to implement) than if two complete n-mos FETs (i.e., each having its own n+ source and drain regions, for a total of four such regions) were formed to implement the conventional transconductance circuit 10 of FIG. 1A. CMOS structure 40 goes even further in providing a more compact structure by eliminating the shared n+ source/drain region 23 of CMOS structure 20. This structure 40, however, typically requires a double polysilicon process so that the two gate electrodes, 45 and 46, can be formed in separate polysilicon layers. Such a double polysilicon process adds to the overall integrated circuit cost. In addition, the overlapping portion of the two polysilicon gate electrodes, 45 and 46, form a capacitor with the gate oxide material (hatched area) separating the two gate electrodes.

When more current providing capability is required than what one pair of n-mos FETs can provide, additional pairs can be connected in parallel. FIG. 2A illustrates, for example, a cascode transconductance circuit 50 comprising two pairs of n-mos FETs, 52 and 54, wherein each pair is identically formed as the conventional cascode transconductance circuit 10 of FIG. 1A.

FIGS. 2B and 2C illustrate, as examples, two conventional CMOS structures, 60 and 80, respectively, for implementing the conventional cascode transconductance circuit 50 in an integrated circuit, wherein CMOS structure 60 of FIG. 2B corresponds to the CMOS structure 20 of FIG. 1B, and CMOS structure 80 of FIG. 2C corresponds to the CMOS structure 40 of FIG. 1C.

SUMMARY OF THE INVENTION

Ongoing goals for each new generation of integrated circuit chips include faster integrated circuits, and cheaper integrated circuits. Thus new integrated circuits are continually required that can operate at ever higher frequencies, and that have implementations that require ever smaller silicon area.

Accordingly, one object of the present invention is a cascode transconductance circuit which has a higher frequency response than conventional cascode transconductance circuits.

Another object of the present invention is a CMOS structure for a cascode transconductance circuit, which requires less die area to form the cascode transconductance circuit on a surface of an integrated circuit die than conventional CMOS structures for cascode transconductance circuits.

These and additional objects are accomplished by the various aspects of the present invention, wherein briefly stated, one aspect of the present invention accomplishes one or more of these objects by a cascode transconductance circuit including at least one pair of serially connected together transistors, wherein the tied together gates of the transistors receive an input voltage Vin which causes an output current Iout to flow through the transistors in response thereof. To ensure that a current sinking (n-mos) or sourcing (p-mos) transistor (hereinafter referred to as "sink/source" transistor) of each pair of transistors operates in its saturated region, a cascoding transistor of each pair of transistors has a threshold voltage having an absolute value at least 0.1 volts less than that of the current sink/source transistor.

Another aspect of the present invention is a CMOS structure for a self-cascoding transconductance circuit. The circuit is called self-cascoding, because, instead of being driven by a separate bias voltage Vcasc, each gate of a cascoding transistor in the structure is connected to a gate of a corresponding current sink/source transistor, and driven by an input voltage Vin, along with the gate of the current sink/source transistor. To ensure that the current sink/source transistor operates in its saturated region, the cascoding transistor has a threshold voltage having an absolute value at least 0.1 volts less than that of the current sink/source transistor.

The CMOS structure includes a gate structure, and two doped threshold adjust regions formed beneath the gate structure. The gate structure is shared by a cascoding and associated, current sink/source transistor, respectively effectuated by the two doped threshold adjust regions. The types and dopant concentrations of the two threshold adjust regions are selected such that a threshold voltage associated with the gate and the threshold adjust region corresponding to the cascoding transistor has an absolute value that is at least 0.1 volts less than that of a threshold voltage associated with the gate and the threshold adjust region corresponding to the current sink/source transistor.

Another aspect of the present invention is a method of forming a CMOS structure for a self-cascoding transconductance circuit, wherein the method comprises the steps of: forming first and second threshold adjust regions having a first dopant concentration beneath a surface of a substrate or well, in such a fashion that the first and second threshold adjust regions define a first surface area Lying between the first and second threshold adjust regions; forming first and second gate electrodes over the surface of the substrate or well, in such a fashion that the first gate electrode lies partially over the first threshold adjust region and partially over the first surface area, the second gate electrode lies partially over the second threshold adjust region and partially over the first surface area, and the first and second gate electrodes define a second surface area lying between the first and second gate electrodes; and forming a common drain region beneath the surface of the substrate or well, in such a fashion that the common drain region lies partially beneath each of the first and second gate electrodes, and partially beneath the second surface area, and forming first and second source regions beneath the surface of the substrate or well, in such a fashion that the first source region lies adjacent to and partially beneath the first gate electrode, and the second source region lies adjacent to and partially beneath the second gate electrode.

Additional objects, features and advantages of the various aspects of the present invention will become apparent from the following description of its preferred embodiment, which description should be taken in conjunction with the accompanying drawings.

DETAILED DESCRIPTION OF THE PREFERRED EMBODIMENT

Figure 3A:
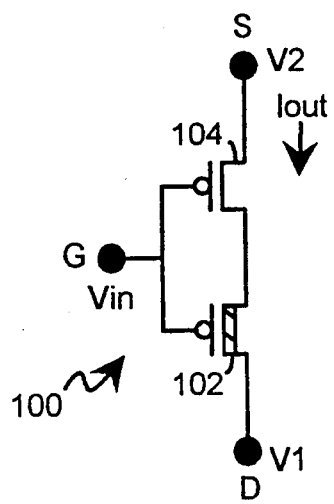
FIG. 3A illustrates a cascode transconductance circuit 100, utilizing aspects of the present invention.

FIG. 3A illustrates a cascode transconductance circuit 100, utilizing aspects of the present invention, which is useful for various circuit applications. For example, it can be used as a current source by keeping its input voltage Vin constant and providing its output current Iout to other circuitry through conventional means such as a current mirror, or it can be used as a cascode amplifier by converting its output current Iout to an output voltage Vout and similarly providing its output voltage Vout to other circuitry through conventional means.

The circuit 100 is formed by serially connecting a pair of p-mos FETs, 102 and 104, together such that the drain of p-mos FET 104 is connected to the source of p-mos FET 102, and the gates of the two p-mos FETs are tied together at node G. By applying a voltage, typically Vdd, to the source of p-mos FET 104 and an appropriate input voltage Vin to the connected together gates of p-mos FETs, 102 and 104, an output current Iout flows through the p-mos FETs, 102 and 104, with p-mos FET 104 acting as a current source transistor and p-mos FET 102 acting as a cascode transistor.

To ensure that p-mos FETs, 102 and 104, both operate in their saturated regions, their respective gate-to-source voltages, Vgs1 and Vgs2, must each be less than their respective threshold voltages, Vt1 and Vt2 (i.e., Vgs1 < Vt1 and Vgs2 < Vt2). Since the respective gates of p-mos FETs, 102 and 104, are tied together at node G, this saturation condition is facilitated by designing the threshold voltage Vt2 of p-mos FET 104 to be at least, for example, 0.1 volts greater than the threshold voltage Vt1 of p-mos FET 102.

In the preferred embodiment depicted in FIG. 3A, p-mos FET 104 has a threshold voltage of nominally $-0.7$ volts and p-mos FET 102 has a threshold voltage of nominally zero volts, wherein the zero-threshold p-mos FET is indicated by hatching between its source and drain (e.g., p-mos FET 102). Because of process variances and other causes, the threshold voltages for p-mos FETs 102 and 104 may vary significantly from their nominally designed values. As a practical matter, therefore, an acceptable range of threshold voltages for each p-mos FET should be determined, preferably by considering the application in which the cascode transconductance circuit 100 is to be used. For most applications, however, a range between $-0.6$ to $-1.1$ volts for the threshold voltage Vt2 for p-mos FET 104 is believed to be acceptable (i.e., $-1.1 \leq Vt2 \leq -0.6$ volts), and a range between $-0.2$ and $+0.2$ volts for threshold voltage Vt1 of p-mos FET 102 is believed to be acceptable (i.e., $-0.2 \leq Vt1 \leq 0.2$ volts).

Figure 3B:
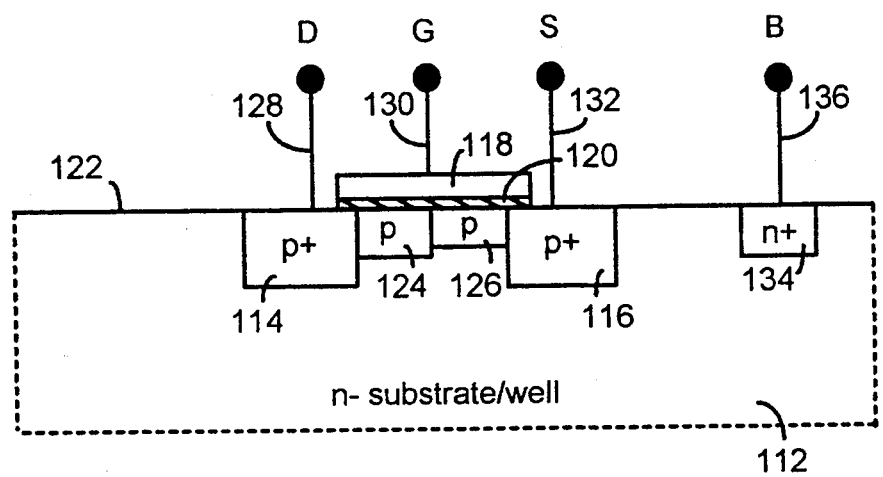
FIG. 3B illustrates, as an example, a CMOS structure 110 which utilizes aspects of the present invention to implement the cascode transconductance circuit 100 of FIG. 3A.

FIG. 3B illustrates, as an example, a CMOS structure 110 which utilizes aspects of the present invention to implement the cascode transconductance circuit 100 of FIG. 3A. The structure 110 includes p+ drain and source regions, 114 and 116, respectively, formed in an n− type substrate or well 112, and a gate electrode 118 formed over a gate oxide layer 120 which in turn, is formed over a surface 122 of the n− type substrate or well 112. Contacts 128, 130 and 132 provide nodes corresponding to D, G and S, respectively, of FIG. 3A, by electrically connecting to the p+ drain region 114, the gate electrode 118, and the p+ source region 116, respectively, of the CMOS structure 110. An n+ diffusion region 134 is also shown in FIG. 3B, because the n− type substrate or well 112 is preferably biased to a voltage source Vdd through contact 136 at node B.

Between the p+ drain and source regions, 114 and 116, respectively, and beneath the gate electrode 118, are preferably two p type threshold adjust regions, 124 and 126. The p type dopant concentrations of the two threshold adjust regions, 124 and 126, are selected such that a threshold voltage corresponding to the gate electrode 118 and the p type threshold adjust region 126 is at least 0.1 volts less than a threshold voltage corresponding to the gate electrode 118 and the p type threshold adjust region 124. In particular, in the preferred embodiment of the present invention, the dopant concentrations are so selected such that the threshold voltage corresponding to the gate electrode 118 and the p type threshold adjust region 126 is in the range of $-1.1 \leq Vt \leq -0.6$ volts, and the threshold voltage corresponding to the gate electrode 118 and the p type threshold adjust region 124 is in the range of $-0.2 \leq Vt \leq 0.2$ volts.

Effectively, the two p type threshold adjust regions, 124 and 126, implement p-mos FETs 102 and 104, respectively, of FIG. 3A. When an input voltage Vin is applied to the gate electrode 118 of the CMOS structure 110, two space charge regions are formed beneath the gate structure. A first space charge region is formed in the p type threshold adjust region 126. This first space charge region is initiated at the interface between the p+ source 116 and the p type threshold adjust region 126, because of the different dopant concentrations of the two regions, wherein a p+ indicates a relatively higher p type dopant concentration than a p. A second space charge region is formed in the p type threshold adjust region 124. This second space charge region is initiated at the interface between the two p type threshold adjust regions, 126 and 124, because of the different dopant concentrations of the two regions, wherein the larger region (e.g., p type threshold adjust region 124) indicates a higher dopant concentration than the smaller region (e.g., p type threshold adjust region 126).

Particular dopant concentrations for the p+ type drain and source regions, 114 and 116, respectively, and the p type threshold adjust regions, 124 and 126, are provided, for example, in application Ser. No. 07/902,914, filed on Jun. 23, 1992, entitled CMOS Process and Circuit Including Zero Threshold Transistors, which application is assigned to the same assignee as the present invention, and is incorporated herein by reference.

Figure 1A:
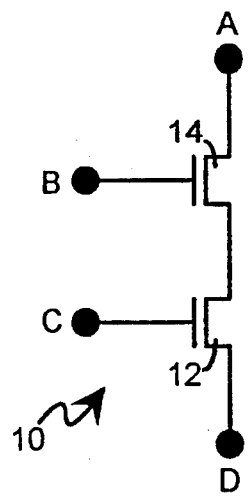
FIG. 1A illustrates, as an example, a conventional, cascode transconductance circuit.
Figure 1B:
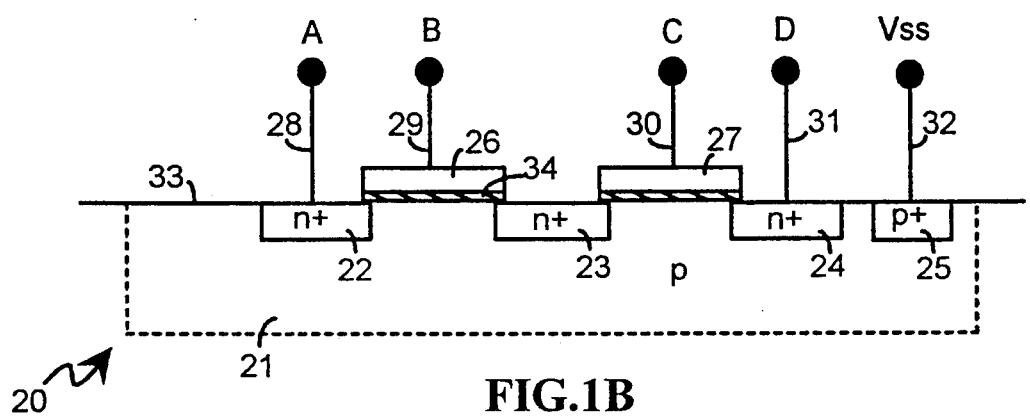
FIGS. 1B and 1C illustrate, as examples, CMOS structures for implementing the conventional, cascode transconductance circuit of FIG. 1A.
Figure 1C:
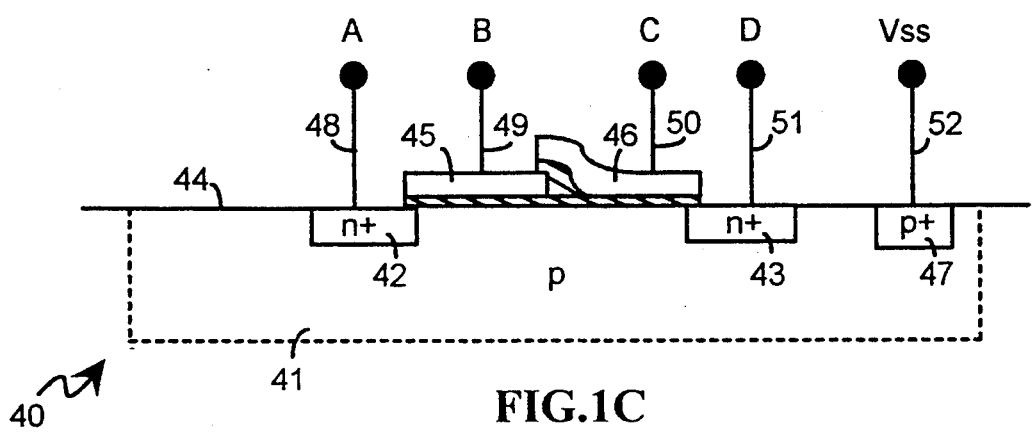

In comparing the CMOS structure 110 with the prior art structures depicted in FIGS. 1B and 1C, it is apparent that the CMOS structure 110 presents a more compact implementation for a cascode transconductance circuit than the prior art structures. In particular, the CMOS structure 110 only requires one gate electrode for its implementation, whereas both prior art implementations require two gate electrodes. Further, the prior art structure of FIG. 1B also requires an additional source/drain region 23. On the other hand, the CMOS structure 110 requires that at least one and preferably two p type threshold adjust regions (e.g., 124 and 126) be formed beneath its gate electrode 118.

Figure 4A:
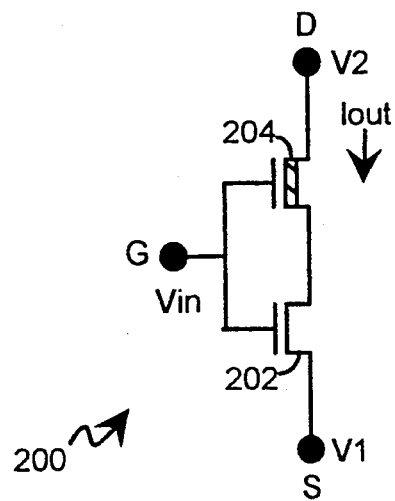
FIG. 4A illustrates a cascode transconductance circuit 200, utilizing aspects of the present invention.

FIG. 4A illustrates a cascode transconductance circuit 200, utilizing aspects of the present invention. The circuit 200 is formed by serially connecting a pair of n-mos FETs, 202 and 204, together such that the source of n-mos FET 204 is connected to the drain of n-mos FET 202, and the gates of the two n-mos FETs are tied together at node G. By applying a voltage, typically ground, to the source of n-mos FET 202 at node S and an appropriate input voltage Vin to the connected together gates of n-mos FETs, 202 and 204, an output current Iout flows through the n-mos FETs, 202 and 204, with n-mos FET 202 acting as a current sink transistor and n-mos FET 204 acting as a cascode transistor.

To ensure that n-mos FETs, 202 and 204, both operate in their saturated regions, their respective gate-to-source voltages, Vgs1 and Vgs2, must each be higher than their respective threshold voltages, Vt1 and Vt2 (i.e., Vgs1 > Vt1 and Vgs2 > Vt2). Since the respective gates of n-mos FETs, 202 and 204, are tied together at node G, this saturation condition is facilitated by designing the threshold voltage Vt2 of n-mos FET 204 to be at least, for example, 0.1 volts less than the threshold voltage Vt1 of n-mos FET 202.

In the preferred embodiment depicted in FIG. 4A, n-mos FET 202 has a threshold voltage of nominally 0.7 volts and n-mos FET 204 has a threshold voltage of nominally zero volts, wherein the zero-threshold n-mos FET is indicated by hatching between its source and drain (e.g., n-mos FET 204). Because of process variances and other causes, the threshold voltages for n-mos FETs 202 and 2204 may vary significantly from their nominally designed values. As a practical matter, therefore, an acceptable range of threshold voltages for each n-mos FET should be determined, preferably by considering the application in which the cascode transconductance circuit 200 is to be used. For most applications, however, a range between 0.6 to 1.1 volts for the threshold voltage Vt1 of n-mos FET 202 is believed to be acceptable (i.e., $0.6 \leq Vt1 \leq 1.1$ volts), and a range between −0.2 and +0.2 volts for the threshold voltage Vt2 of n-mos FET 204 is believed to be acceptable (i.e., $-0.2 \leq Vt2 \leq 0.2$ volts).

Figure 4B:
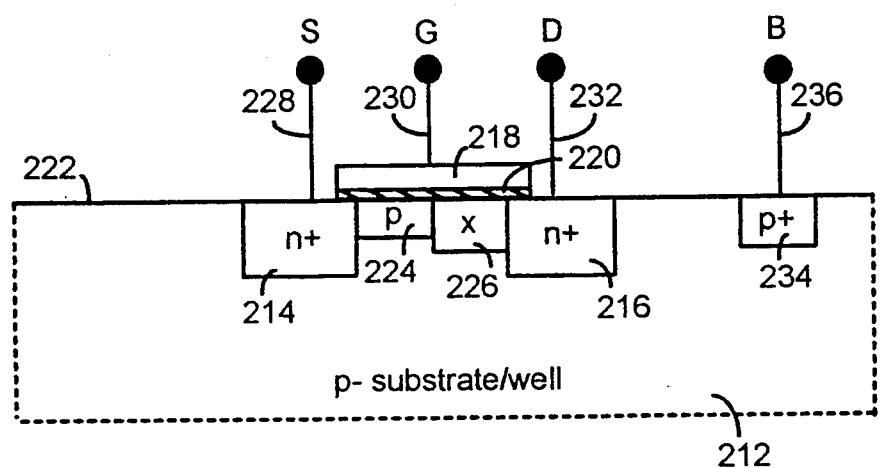
FIG. 4B illustrates, as an example, a CMOS structure 210 which utilizes aspects of the present invention to implement the cascode transconductance circuit 200 of FIG. 4A.

FIG. 4B illustrates, as an example, a CMOS structure 210 which utilizes aspects of the present invention to implement the cascode transconductance circuit 200 of FIG. 4A. The structure 210 includes n+ source and drain regions, 214 and 216, respectively, formed in a p− type substrate or well 212, and a gate electrode 218 formed over a gate oxide layer 220 which in turn, is formed over a surface 222 of the p− type substrate or well 212. Contacts 228, 230, and 232 provide nodes corresponding to S, G, and D, respectively, of FIG. 4A, by electrically connecting to the n+ source region 214, the gate electrode 218, and the n+ drain region 216, respectively, of the CMOS structure 210. A p+ diffusion region 234 is also shown in FIG. 4B, because the p− type substrate or well 212 is preferably biased to ground Vss through contact 236 at node B.

Between the n+ source and drain regions, 214 and 216, respectively, and beneath the gate electrode 218, is at least one p type threshold adjust region 224. A second threshold adjust region 226 is labeled x, because this region 226 may be either a p type threshold adjust region, an n type threshold adjust region, or merely an extension of the p− type substrate or well 212. The dopant concentrations of the two threshold adjust regions, 224 and 226, are selected such that a threshold voltage corresponding to the gate electrode 218 and the threshold adjust region 224 is at least 0.1 volts greater than a threshold voltage corresponding to the gate electrode 218 and the threshold adjust region 226. In particular, in the preferred embodiment of the present invention, the dopant concentrations are so selected such that the threshold voltage corresponding to the gate electrode 218 and the threshold adjust region 226 is in the range of $-0.2 \leq Vt \leq 0.2$ volts, and the threshold voltage corresponding to the gate electrode 218 and the threshold adjust region 224 is in the range of $0.6 \leq Vt 1.1$ volts.

Effectively, the two threshold adjust regions, 224 and 226, implement n-mos FETs 202 and 204, respectively, of FIG. 4A. When an input voltage Vin is applied to the gate electrode 218 of the CMOS structure 210, two space charge regions are formed beneath the gate structure. A first space charge region is formed in the x type threshold adjust region 226. This first space charge region is initiated at the interface between the n+ type drain region 216 and the x type threshold adjust region 226, because of the different dopant concentrations or types of the two regions. A second space charge region is formed in the p type threshold adjust region 224. This second space charge region is initiated at the interface between the two threshold adjust regions, 224 and 226, because of the different dopant concentrations or types of these two regions.

Particular dopant concentrations for the n+ type source and drain regions, 214 and 216, respectively, and the p and x (e.g., p or n) type threshold adjust regions, 224 and 226, are provided, for example, in application Ser. No. 07/902,914, filed on Jun. 23, 1992, entitled CMOS Process and Circuit Including Zero Threshold Transistors, which is assigned to the same assignee as the present invention, and is incorporated herein by reference.

In comparing the CMOS structure 210 with the prior art structures depicted in FIGS. 1B and 1C, it is apparent that the CMOS structure 210 presents a more compact implementation for a cascode transconductance circuit than the prior art structures. In particular, similar to the CMOS structure 110 in FIG. 3B, the CMOS structure 210 only requires one gate electrode for its implementation, whereas both prior art implementations require two gate electrodes. Further, the prior art structure of FIG. 1B also requires an additional source/drain region 23. On the other hand, the CMOS structure 210 requires that at least one threshold adjust region 224, and possibly two, be formed beneath its gate electrode 218.

Figure 5A:
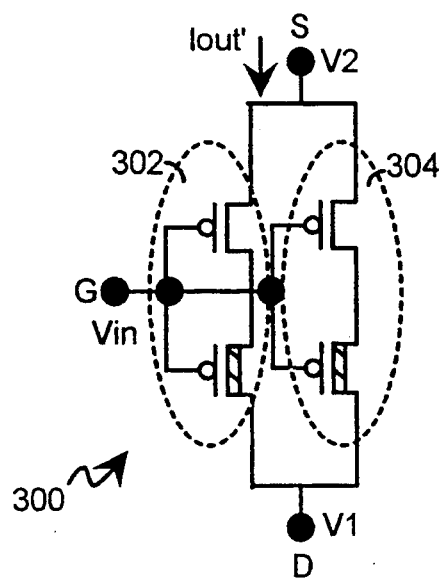
FIG. 5A illustrates a cascode transconductance circuit 300, utilizing aspects of the present invention.

FIG. 5A illustrates a cascode transconductance circuit 300, utilizing aspects of the present invention. The cascode transconductance circuit 300 is formed by connecting in parallel two or more pairs of p-mos FETs (e.g., 302 and 304), wherein each pair is identical to the cascode transconductance circuit 100 of FIG. 3A. The tied together gates of each of the pairs of p-mos FETs (e.g., 302 and 304) are then tied together at node G so that all of the gates of all of the p-mos FETs in the cascode transconductance circuit 300 can be driven by an input voltage Vin at node G. Each pair of p-mos FETs (e.g., 302 and 304) has a first p-mos FET corresponding to p-mos FET 102 and a second p-mos FET corresponding to p-mos FET 104 of cascode transconductance circuit 100. By applying a voltage, typically Vdd, to the tied together sources of the corresponding p-mos FETs 104 of all of the pairs of p-mos FETs (e.g., 302 and 304) at node S and an appropriate input voltage Vin to the connected together gates of all of the pairs of p-mos FETs (e.g., 302 and 304), an output current Iout' flows through the parallel connected together pairs of p-mos FETs (e.g., 302 and 304), to the tied together drains of the corresponding p-mos FETs 102 of all of the pairs of p-mos FETs (e.g., 302 and 304) at node D, which acts as an output node of the circuit 300. Since each pair of p-mos FETs (e.g., 302 and 304) is expected to draw an output current Iout equal to the output current Iout of the cascode transconductance circuit 100, the combined output current Iout' of all of the pairs of p-mos FETs is expected to be equal to n. Iout, where n is the number of pairs of p-mos FETs in the cascode transconductance circuit 300.

Figure 5B:
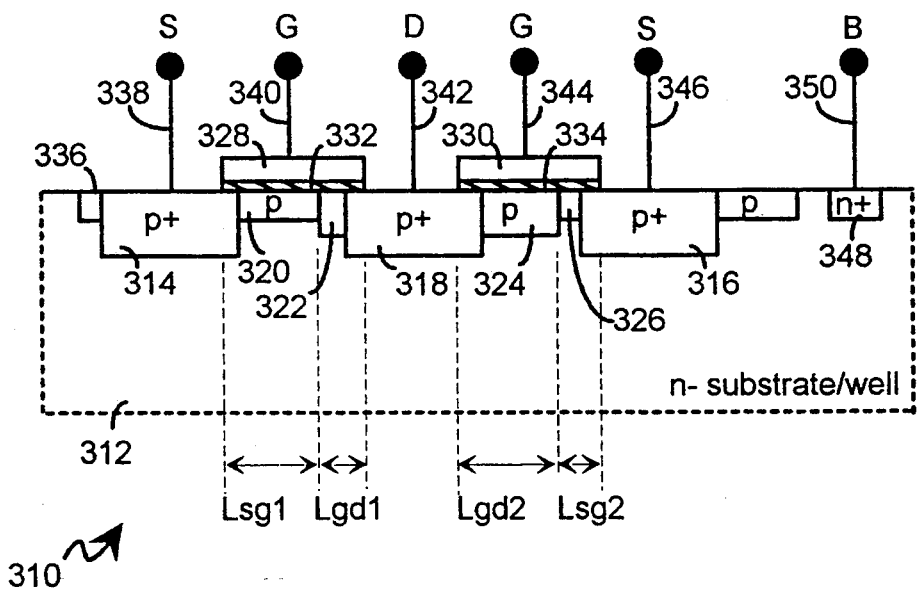
FIG. 5B illustrates, as an example, a CMOS structure 310 which utilizes aspects of the present invention to implement the cascode transconductance circuit 300 of FIG. 5A.

FIG. 5B illustrates, as an example, a CMOS structure 310 which utilizes aspects of the present invention to implement the cascode transconductance circuit 300 of FIG. 5A. The structure 310 includes two p+ source regions, 314 and 316, and one shared p+ drain region 318 formed in an n− type substrate or well 312, and two gate electrodes, 328 and 330, formed over gate oxide layers, 332 and 334, respectively, which in turn, are formed over a surface 336 of the n− type substrate or well 312. Contacts 338 and 346 provide a node corresponding to node S of FIG. 5A by electrically connecting together and to the p+ source regions, 314 and 316, respectively. Contacts 340 and 344 provide a node corresponding to node G of FIG. 5A by electrically connecting together and to the gate electrodes, 328 and 330, respectively. Contact 342 provides a node corresponding to node D of FIG. 5A by electrically connecting to the p+ drain region 318. An n+ diffusion region 348 is also shown in FIG. 5B, because the n− type substrate or well 312 is preferably biased to a voltage source Vdd through contact 350 at node B.

Beneath each of the gate electrodes, 328 and 330, are preferably two p type threshold adjust regions. For example, beneath gate electrode 328 are two p type threshold adjust regions, 320 and 322, and beneath gate electrode 330 are two p type threshold adjust regions, 324 and 326. The p type dopant concentrations of the two threshold adjust regions, 320 and 322, are relatively selected so that a threshold voltage corresponding to the gate electrode 328 and the p type threshold adjust region 320 is at least 0.1 volts less than a threshold voltage corresponding to the gate electrode 328 and the p type threshold adjust region 322. Likewise, the p type dopant concentrations of the two threshold adjust regions, 324 and 326, are relatively selected so that a threshold voltage corresponding to the gate electrode 330 and the p type threshold adjust region 326 is at least 0.1 volts less than a threshold voltage corresponding to the gate electrode 330 and the p type threshold adjust region 324. For example, in the preferred embodiment of the present invention, the dopant concentrations are selected such that the threshold voltage corresponding to the gate electrodes, 328 and 330, and their respective p type threshold adjust regions, 322 and 324, are in the range of $-0.2 \leq Vt \leq 0.2$ volts, and the threshold voltage corresponding to the gate electrodes, 328 and 330, and their respective p type threshold adjust regions, 320 and 326, are in the range of $-1.1 \leq Vt \leq -0.6$ volts. In particular, the dopant concentrations for the p+ type drain and two p+ source regions, 318, 314 and 316, respectively, and the p type threshold adjust regions, 320, 322, 324, and 326, are preferably the same as corresponding regions in FIG. 3B.

Effectively, the two p type threshold adjust regions 320 and 322, implement one pair of p-mos FETs (e.g., 302 or 304 in FIG. 5A) by corresponding to p-mos FETs, 104 and 102, respectively, of the cascode transconductance circuit 100, and the two p type threshold adjust regions, 324 and 326, implement another pair of p-mos FETs (e.g., 302 or 304 in FIG. 5A) by also corresponding to p-mos FETs, 102 and 104, respectively, of the cascode transconductance circuit 100 of FIG. 3A. Consequently, when an input voltage Vin is applied to the connected together gate electrodes, 328 and 330, of the CMOS structure 310, two space charge regions are formed beneath each of the gate electrodes, 328 and 330. For example, beneath gate electrode 328, a first space charge region is formed in the p type threshold adjust region 320. This first space charge region is initiated at the interface between the p+ source region 314 and the p type threshold adjust region 320, because of the different p type dopant concentrations of the two regions. A second space charge region is formed in the p type threshold adjust region 322. This second space charge region is initiated at the interface between the two p type threshold adjust regions, 320 and 322, because of the different p type dopant concentrations of these two regions.

Likewise, beneath gate electrode 330, a first space region is formed in the p type threshold adjust region 326. This first space charge region is initiated at the interface between the p+ type source 316 and the p type threshold adjust region 326, because of the different p type dopant concentrations of the two regions. A second space charge region is formed in the p type threshold adjust region 324. This second space charge region is initiated at the interface between the two p type threshold adjust regions, 326 and 324, because of the different p type dopant concentrations of these two regions.

Figure 2A:
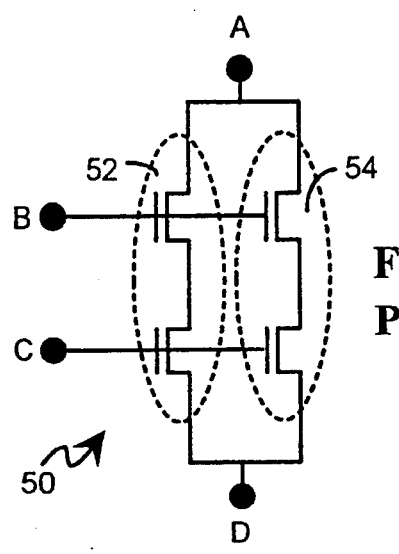
FIG. 2A illustrates, as an example, a conventional cascode: transconductance circuit combining two of the circuits of FIG. 1A by connecting them together in parallel.
Figure 2B:
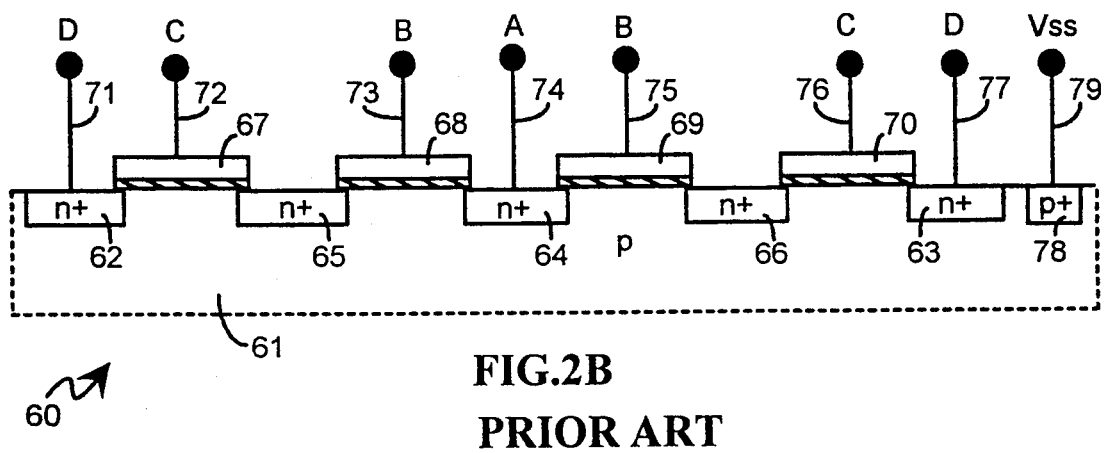
FIGS. 2B and 2C illustrate, as examples, CMOS structures for implementing the conventional cascode transconductance circuit of FIG. 2A.
Figure 2C:
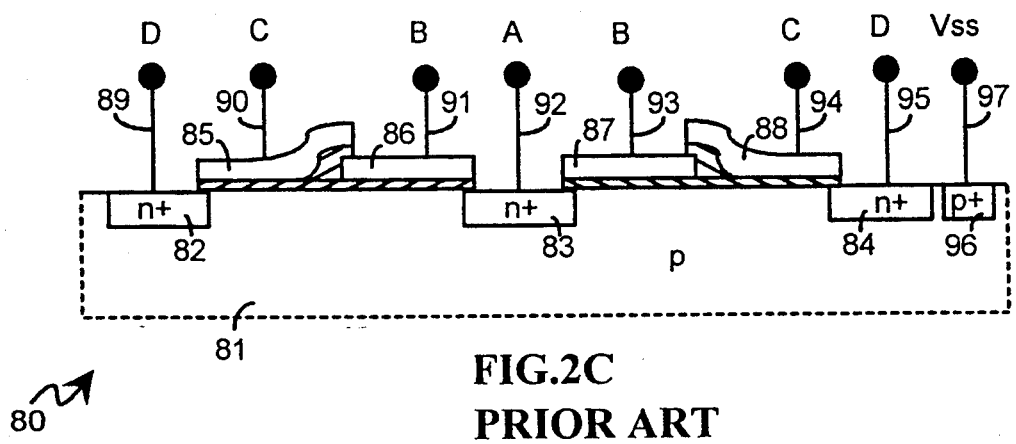

In comparing the CMOS structure 310 with the prior art structures depicted in FIGS. 2B and 2C, it is apparent that the CMOS structure 310 presents a more compact implementation for a cascode transconductance circuit than the prior art structures. In particular, the CMOS structure 31.0 only requires two gate electrodes for its implementation of two pairs of p-mos FETs (e.g., 302 and 304), whereas both prior art implementations require four gate electrodes. Further, the prior art structure of FIG. 2B also requires two additional source/drain regions, 65 and 66. On the other hand, the CMOS structure 310 requires that at least one and preferably two p type threshold adjust regions be formed beneath each of its two gate electrodes, 328 and 330.

FIGS. 6A–6D, illustrate, as examples, several steps of a method, utilizing aspects of the present invention, for fabricating the CMOS structure 310 of FIG. 5B. Starting in FIGS. 6A and 6B, at least two p type threshold adjust regions, 320 and 326, and at least one p type threshold adjust region 322 having a higher p type dopant concentration than the two p type threshold adjust regions, 320 and 326, are formed at preselected locations on the surface 336 of an n− type substrate or well 312 using, for example, conventional photolithography and ion implantation techniques. Although FIGS. 6A and 6B indicate that the two p type threshold adjust regions, 320 and 326, are formed prior to the p type threshold adjust region 322, it is to be appreciated that it is also contemplated within the scope of the present invention to alternatively, form the p type threshold adjust region 322 prior to forming the two p type threshold adjust regions, 320 and 326, since it is the spatial arrangement of the p type threshold adjust regions, e.g., p type threshold adjust region 322 formed between p type threshold adjust regions, 320 and 326, not the order of their formation that is important in practicing the present invention.

Figure 6A:
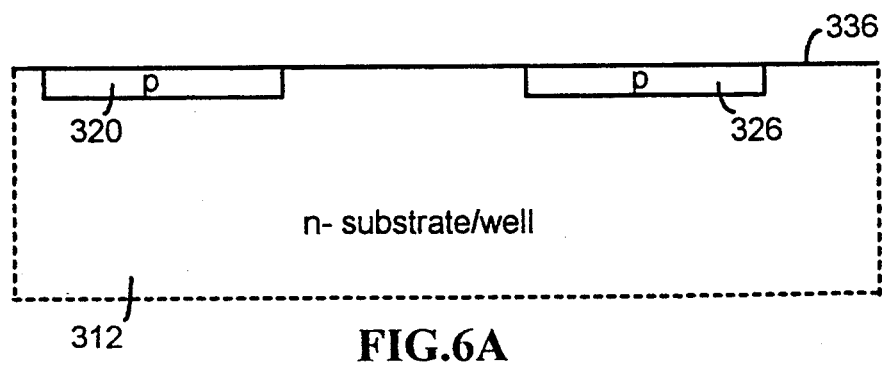
FIGS. 6A–6D, illustrate, as examples, several steps of a method, utilizing aspects of the present invention, for fabricating the CMOS structure 310 of FIG. 5B.
Figure 6B:
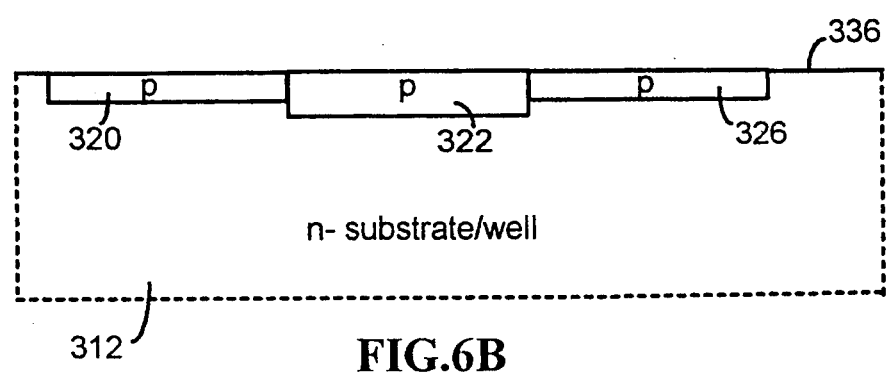
Figure 6C:
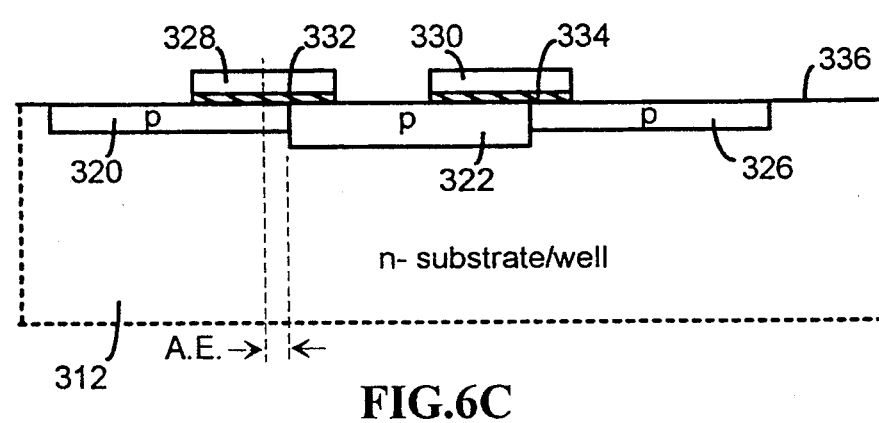

Referring now to FIG. 6C, and using, for example, conventional chemical vapor deposition ("CVD") and/or sputtering techniques, gate oxide and metallization layers (not shown) are both formed over the surface 336 of the n− type substrate or well 312, and then using, for example, conventional photolithography and etching techniques, gate electrodes, 328 and 330, and gate oxide regions, 332 and 334, are formed from the metallization and gate oxide layers, respectively. Because of alignment errors occurring, for example, in the photolithography process, the gate electrodes, 328 and 330, may not be formed in their exact preferred locations with respect to the preformed p type threshold adjust regions, 320, 322, and 326. For example, preferably, gate electrode 328 would be formed over the surface 336 of the n− type substrate or well 312 such that exactly one half of the gate electrode 328 would be formed over the p type threshold adjust region 320 and one half of the gate electrode 328 would be formed over the p type threshold adjust region 322. Similarly, gate electrode 330 would be formed over the surface 336 of the n− type substrate or well 312 such that exactly one half of the gate electrode 330 would be formed over the p type threshold adjust region 322 and one half of the gate electrode 330 would be formed over the p type threshold adjust region 326. The primary significance of such alignment error, depicted as length A.E. in FIG. 6C, is that it affects the saturation current flowing through the respective p type threshold adjust regions, as will be elaborated upon in the discussion that follows.

Figure 6D:
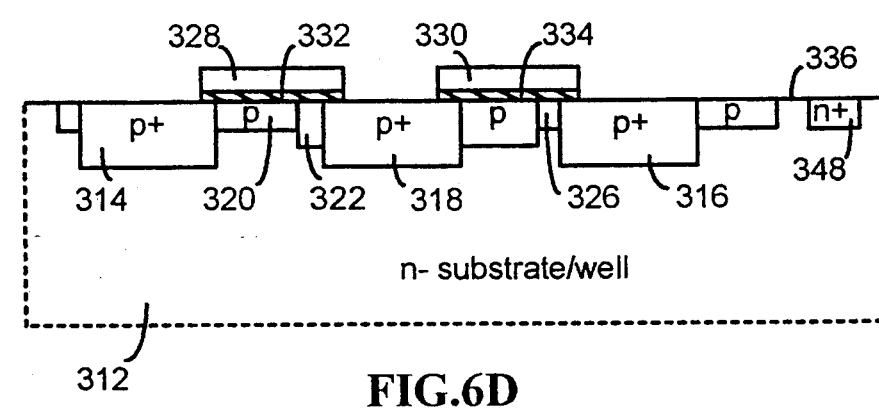

Referring now to FIG. 6D, and again using, for example, conventional photolithography and ion implantation techniques, the p+ source regions, 314 and 316, and the p+ drain region 318 are formed at preselected locations in the surface 336 of the n− type substrate or well 312. Since the p+ source and drain regions self-align to their respective gate electrodes, alignment of these source and drain regions with respect to their respective gate electrodes is not a problem. Also shown in FIG. 6D is an n+ type diffusion region 348, formed, for example, by conventional photolithography and ion implantation or diffusion techniques. As previously described in reference to FIG. 5B, the n+ diffusion region 348 is provided so that the n− type substrate or well 312 can be biased to a voltage source such as Vdd, for example. Although first shown in FIG. 6D, it is also to be appreciated that the n+ diffusion region 348 can be formed at any time before, during or after the steps described in reference to FIGS. 6A–6D.

Following the formation of the p type threshold adjust regions, 320, 326 and 322, the gate electrodes, 328 and 330, the p+ source regions, 314 and 316, the p+ drain region 318, and the n+ bias diffusion region 348, additional insulating and metallization layers (not shown) are formed, masked and etched, for example, to provide electrical contacts to the various source, drain, gate, and bias diffusion regions of the CMOS structure 310. The resulting metal contacts of these steps are simplistically shown, for illustrative purposes, for example, as contacts 338, 340, 342, 344, 346, and 350 in FIG. 5B.

Referring back now to FIG. 5B, certain features of the CMOS structure 310 are now pointed out to better understand the alignment error problem, as well as, how the method described in reference to FIGS. 6A-6D solves or alleviates those problems. As described in reference to FIG. 6C, the alignment problem between each gate electrode and its respective p type threshold adjust regions results from one of the gate electrode's p type threshold adjust regions extending further than half way beneath the gate electrode, and the other of the gate electrode's p type threshold adjust regions extending less than half way beneath the gate electrode. For example, referring to FIG. 5B, gate electrode 328 has been formed with respect to the p type threshold adjust regions, 320 and 322, such that p type threshold adjust region 320 extends to a length Lsg1 from an edge adjacent to the p type threshold adjust region 320 and towards an opposite edge of the gate electrode 328, and p type threshold adjust region 322 extends to a length Lgd1 from an edge adjacent to the p type threshold adjust region 322 and towards an opposite edge of the gate electrode 328, wherein the length Lsg1>Lgd1.

Since the current flowing through a region is inversely related to the length of the region, the p-mos FET corresponding to the p type threshold adjust region 320 (e.g., 104 in FIG. 3A) will source less current than the p-mos FET corresponding to the "ideal" p type threshold adjust region 126 of FIG. 3B (e.g., 104 in FIG. 3A), and the p-mos FET corresponding to the p type threshold adjust region 326 (e.g., 104 in FIG. 3A) will source more current than the p-mos FET corresponding to the "ideal" p type threshold adjust region 126 of FIG. 3B (e.g., 104 in FIG. 3A). Consequently, if p type threshold adjust region 320 corresponds, for example, to p-mos FET pair 302 and in particular, to the p-mos FET of pair 302 which corresponds to p-mos FET 104 of cascode transconductance circuit 100, and if p type threshold adjust region 326 corresponds, for example, to p-mos FET pair 304 and in particular, to the p-mos FET of pair 304 which corresponds to p-mos FET 104 of cascode transconductance circuit 100, then the slope of Vin vs. Iout (i.e., the transconductance) corresponding to pair 302 will be less steep or smaller than that of the "ideal" cascode transconductance circuit 100 as implemented by CMOS structure 110, and the slope of Vin vs. Iout (i.e., the transconductance) corresponding to pair 304 will be steeper or larger than that of the "ideal" cascode transconductance circuit 100 as implemented by CMOS structure 110.

A key aspect of the present invention, however, is the symmetric design of the CMOS structure 310 which will be further appreciated in the discussion that follows. In particular, the gate electrode 330 has been formed with respect to the p type threshold adjust regions, 326 and 322 (whose portion extending under gate 330 is referenced as 324), such that p type threshold adjust region 326 extends to a length Lsg2 from an edge of the gate electrode 330 adjacent to the p type threshold adjust region 326 towards an opposite edge of the gate electrode 330, and p type threshold adjust region 324 extends to a length Lgd2 from an edge of the gate electrode 330 adjacent to the p type threshold adjust region 324 towards an opposite edge of the gate electrode 330, wherein Lgd2>Lsg2. Conversely, the gate electrode 328 has been formed with respect to the p type threshold adjust regions, 320 and 322, such that p type threshold adjust region 320 extends to a length Lsg1 from an edge of the gate electrode 328 adjacent to the p type threshold adjust region 320 towards an opposite edge of the gate electrode 328, and p type threshold adjust region 322 extends to a length Lgd1 from an edge of the gate electrode 328 adjacent to the p type threshold adjust region 322 towards an opposite edge of the gate electrode 328, wherein Lsg1>Lgd1.

Accordingly, even though each of the lengths Lsg1, Lgd1, Lgd2, and Lsg2 is either less than or greater than the "ideal" length, which is exactly one half of the distance between opposing edges of each gate electrode, the average length of the p type threshold adjust regions corresponding to the gate-to-drain regions (i.e., the average of Lgd1 and Lgd2) is equal to the "ideal" length, and the average length of the p type threshold adjust regions corresponding to the gate-to-source regions (i.e., the average of Lsg1 and Lsg2) is equal to the "ideal" length. Consequently, even though the output current flowing through pair 302 may be larger than the ideal output current Iout of the cascode transconductance circuit 100, and the output current flowing through pair 304 may be smaller than the ideal output current Iout of the cascode transconductance circuit 100, the average current flowing through both pairs 302 and 304 is equal to the ideal output current Iout and consequential, the combined output current Iout' for the CMOS structure 310 is equal to 2*Iout, as in the "ideal" case.

Figure 7A:
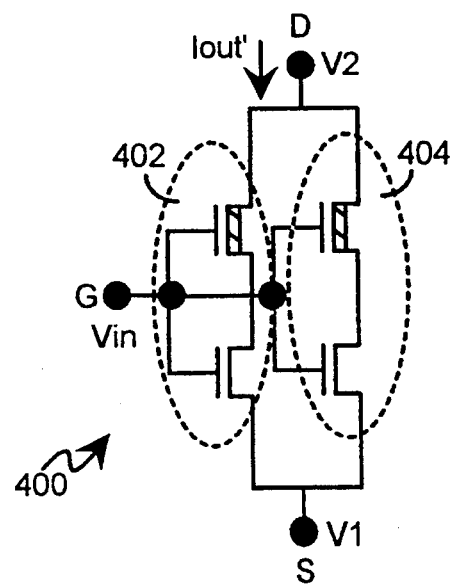
FIG. 7A illustrates a cascode transconductance circuit 400, utilizing aspects of the present invention.

FIG. 7A illustrates a cascode transconductance circuit 400, utilizing aspects of the present invention. The cascode transconductance circuit 400 is formed by connecting in parallel two or more pairs of n-mos FETs (e.g., 402 and 404), wherein each pair is identical to the cascode transconductance circuit 200 of FIG. 4A. The tied together gates of each of the pairs of n-mos FETs (e.g., 402 and 404) are then tied together at node G so that all of the gates of all of the n-mos FETs in the cascode transconductance circuit 400 can be driven by an input voltage Vin at node G. Each pair of n-mos FETs (e.g., 402 and 404) has a first n-mos FET corresponding to n-mos FET 202 and a second n-mos FET corresponding to n-mos FET 204 of cascode transconductance circuit 200. By applying a voltage, typically ground, to the tied together sources of the corresponding n-mos FETs 202 of all of the pairs of n-mos FETs (e.g., 402 and 404) at node S and an appropriate input voltage Vin to the connected together gates of all of the pairs of n-mos FETs (e.g., 402 and 404), an output current Iout' flows through the parallel connected together pairs of n-mos FETs (e.g., 402 and 404) in response thereof. Since each pair of n-mos FETs (e.g., 402 and 404) is expected to draw an output current Iout equal to the output current Iout of the cascode transconductance circuit 200, the combined output current Iout' of all of the pairs of n-mos FETs is expected to be equal to n*Iout, where n is the number of pairs of n-mos FETs in the cascode transconductance circuit 400.

Figure 7B:
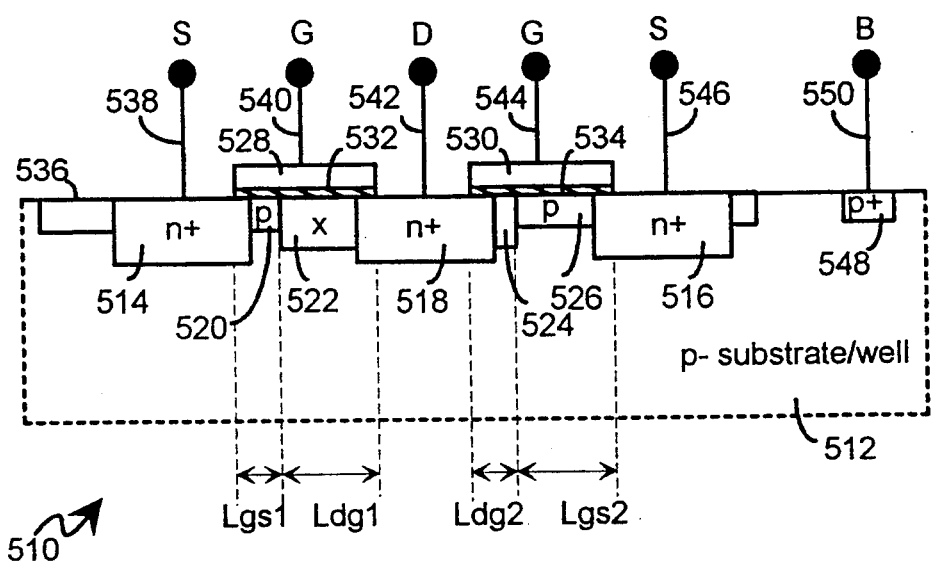
FIG. 7B illustrates, as an example, a CMOS structure 510 which utilizes aspects of the present invention to implement the cascode transconductance circuit 400 of FIG. 7A.

FIG. 7B illustrates, as an example, a CMOS structure 510 which utilizes aspects of the present invention to implement the cascode transconductance circuit 400 of FIG. 7A. The structure 510 includes two n+ source regions, 514 and 516, and one shared n+ drain region 518 formed in a p− type substrate or well 512, and two gate electrodes, 528 and 530, formed over gate oxide layers, 532 and 534, respectively, which in turn, are formed over a surface 536 of the p− type substrate or well 512. Contacts 538 and 546 provide a node corresponding to node S of FIG. 7A by electrically connecting together and to the n+ source regions, 514 and 516, respectively. Contacts 540 and 544 provide a node corresponding to node G of FIG. 7A by electrically connecting together and to the gate electrodes, 528 and 530, respectively. Contact 542 provides a node corresponding to node D of FIG. 7A by electrically connecting to the n+ drain region 518. A p+ diffusion region 548 is also shown in FIG. 7B, because the p− type substrate or well 512 is preferably biased to ground through contact 550 at node B.

Beneath each of the gate electrodes, 528 and 530, is preferably at least one p type threshold adjust region (e.g., 520 and 526). Also shown beneath each of the gate electrodes, 528 and 530, is a second threshold adjust region (e.g., 522 and 524) labeled x. The second threshold adjust regions are labeled x, because these regions 522 and 524 may be either p type threshold adjust regions, n type threshold adjust regions, or merely extensions of the p− type substrate or well 512. The types and/or dopant concentrations of the two threshold adjust regions, 524 and 526, are selected such that a threshold voltage corresponding to the gate electrode 530 and the threshold adjust region 524 is at least 0.1 volts less than a threshold voltage corresponding to the gate electrode 530 and the threshold adjust region 526. Similarly, the types and/or dopant concentrations of the two threshold adjust regions, 522 and 520, are selected such that a threshold voltage corresponding to the gate electrode 528 and the threshold adjust region 522 is at least 0.1 volts less than a threshold voltage corresponding to the gate electrode 528 and the threshold adjust region 520. In the preferred embodiment of the present invention, the types and/or dopant concentrations are selected such that the threshold voltages corresponding to the gate electrodes, 528 and 530, and their respective threshold adjust regions, 522 and 524, are in the range of $-0.2 \leq V_t \leq 0.2$ volts, and the threshold voltages corresponding to the gate electrodes, 528 and 530, and their respective threshold adjust regions, 520 and 526, are in the range of $0.6 \leq V_t \leq 1.1$ volts. In particular, the dopant concentrations for the n+ type drain and two n+ source regions, 518, 514 and 516, respectively, and the threshold adjust regions, 520, 522, 524, and 526, are preferably the same as corresponding regions in FIG. 4B.

Effectively, the two threshold adjust regions 520 and 522, implement one pair of n-mos FETs (e.g., 402 or 404 in FIG. 7A) by corresponding to n-mos FETs, 204 and 202, respectively, of the cascode transconductance circuit 200, and the two threshold adjust regions, 524 and 526, implement another pair of n-mos FETs (e.g., 402 or 404 in FIG. 7A) by also corresponding to n-mos FETs, 202 and 204, respectively, of the cascode transconductance circuit 200 of FIG. 4A. Consequently, when an input voltage Vin is applied to the connected together gate electrodes, 528 and 530, of the CMOS structure 510, two space charge regions are formed beneath each of the gate electrodes, 528 and 530. For example, beneath gate electrode 528, a first space charge region is formed in the x type threshold adjust region 522. This first space charge region is initiated at the interface between the n+ drain region 518 and the x type threshold adjust region 522, because of the different type and/or dopant concentrations of the two regions. A second space charge region is formed in the p type threshold adjust region 520. This second space charge region is also initiated at the interface between the two threshold adjust regions, 520 and 522, because of the different type and/or dopant concentrations of the two regions.

Likewise, beneath gate electrode 530, a first space charge region is formed in the x type threshold adjust region 524. This first space charge region is initiated at the interface between the n+ drain region 518 and the x type threshold adjust region 524, because of the different type and/or dopant concentrations of the two regions. A second space charge region is formed in the p type threshold adjust region 526. This second space charge region is also initiated at the interface between the two threshold adjust regions, 524 and 526, because of the different type and/or dopant concentrations of these two regions.

In comparing the CMOS structure 510 with the prior art structures depicted in FIGS. 2B and 2C, it is apparent that the CMOS structure 510 presents a more compact implementation for a cascode transconductance circuit than the prior art structures. In particular, the CMOS structure 510 only requires two gate electrodes for its implementation of two pairs of n-mos FETs (e.g., 402 and 404), whereas both prior art implementations require four gate electrodes. Further, the prior art structure of FIG. 2B also requires two additional source/drain regions, 65 and 66. On the other hand, the CMOS structure 510 requires that at least one p type threshold adjust region be formed beneath each of its two gate electrodes, 528 and 530.

FIGS. 8A-8D, illustrate, as examples, several steps of a method, utilizing aspects of the present invention, for fabricating the CMOS structure 510 of FIG. 7B. Starting in FIGS. 8A and 8B, at least two p type threshold adjust regions, 520 and 526, are concurrently formed at preselected locations on the surface 536 of a p− type substrate or well 512 using, for example, conventional photolithography and ion implantation techniques. Before or after the two p type threshold adjust regions, 520 and 526, are formed, an x type threshold adjust region 522 may or may not be formed, depending upon the characteristics of the CMOS process being used. For example, if a threshold voltage corresponding to the x type threshold adjust region 522 is desired to be increased, then a p type dopant concentration may be implanted in this region. On the other hand, if the threshold voltage corresponding to the x type threshold adjust region 522 is desired to be reduced, then an n type dopant concentration may be implanted in this region. Finally, if the threshold voltage corresponding to the x type threshold adjust region 522 is satisfactory as is, then no additional implant need be performed in this region.

Figure 8A:
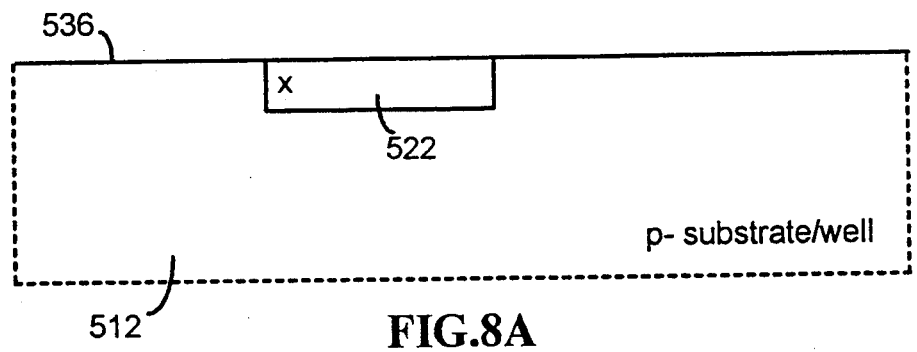
FIGS. 8A–8D, illustrate, as examples, several steps of a method, utilizing aspects of the present invention, for fabricating the CMOS structure 510 of FIG. 7B.
Figure 8B:
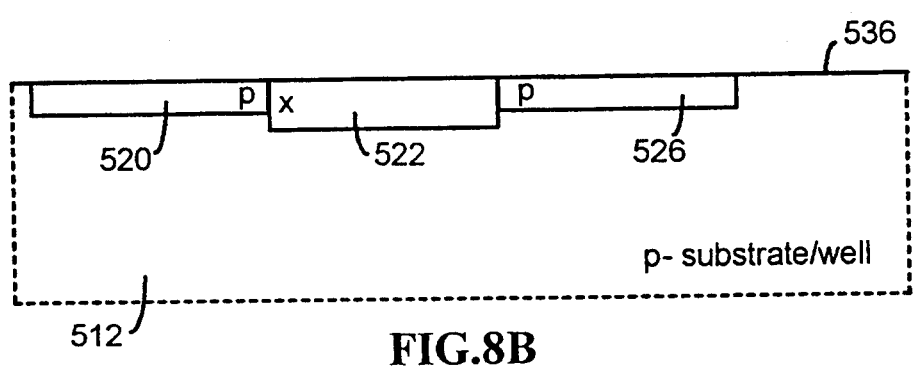
Figure 8C:
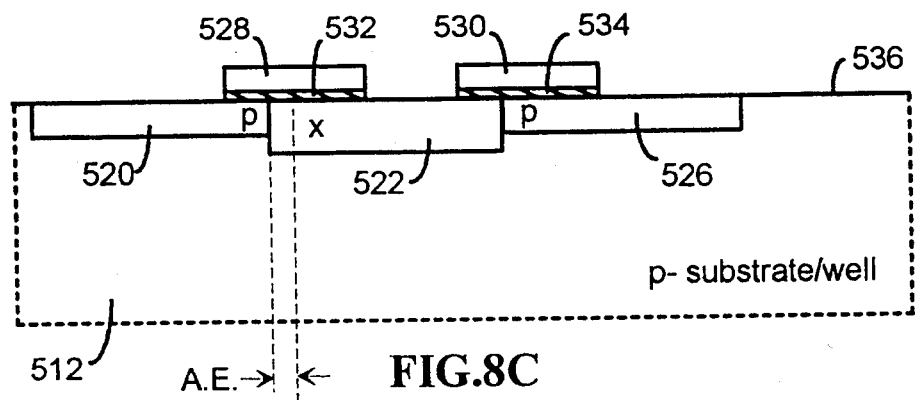

Referring now to FIG. 8C, and using, for example, conventional chemical vapor deposition ("CVD") and/or sputtering techniques, gate oxide and metallization layers, (not shown) are both formed over the surface 536 of the n− type substrate or well 512, and then using, for example, conventional photolithography and etching techniques, gate electrodes, 528 and 530, and gate oxide regions, 532 and 534, are formed from the metallization and gate oxide layers, respectively. Because of alignment errors occurring, for example, in the photolithography process, the gate electrodes, 528 and 530, may not be formed in their exact preferred locations with respect to the preformed threshold adjust regions, 520, 522, and 526. For example, preferably, gate electrode 528 would be formed over the surface 536 of the p− type substrate or well 512 such that exactly one half of the gate electrode 528 would be formed over the p type threshold adjust region 520 and one half of the gate electrode 528 would be formed over the x type threshold adjust region 522. Similarly, gate electrode 530 would be formed over the surface 536 of the p− type substrate or well 512 such that exactly one half of the gate electrode 530 would be formed over the x type threshold adjust region 522 and one half of the gate electrode 530 would be formed over the p type threshold adjust region 526. As previously described in reference to FIGS. 6A–6D, the primary significance of such alignment error, depicted as length A.E. in FIG. 8C, is that it affects the saturation current flowing through the respective threshold adjust regions.

Figure 8D:
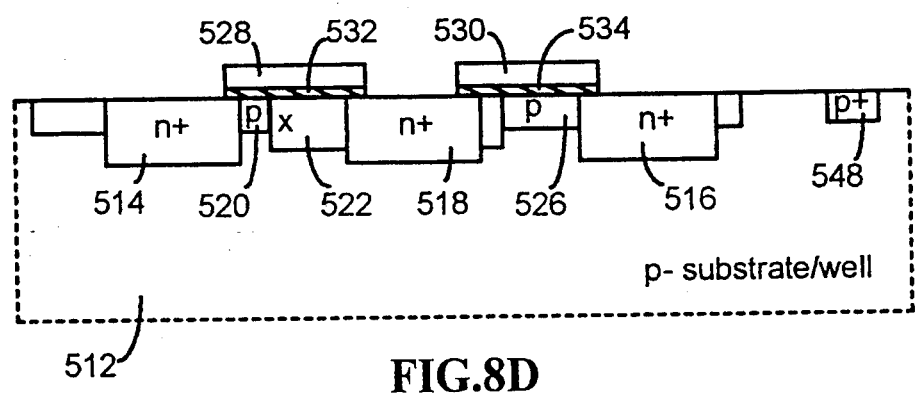

Referring now to FIG. 8D, and again using, for example, conventional photolithography and ion implantation techniques, the n+ source regions, 514 and 516, and the n+ drain region 518 are formed at preselected locations in the surface 536 of the p− type substrate or well 512. Since the n+ source and drain regions self-align to their respective gate electrodes, alignment of these source and drain regions with respect to their respective gate electrodes is not a problem. Also shown in FIG. 8D is a p+ type diffusion region 548, formed, for example, by conventional photolithography and ion implantation or diffusion techniques. As previously described in reference to FIG. 7B, the p+ diffusion region 548 is provided so that the p− type substrate or well 512 can be biased to ground, for example. Although first shown in FIG. 8D, it is also to be appreciated that the p+ diffusion region 548 can be formed at any time before, during or after the steps described in reference to FIGS. 8A–8D.

Following the formation of the threshold adjust regions, 520, 526 and 522, the gate electrodes, 528 and 530, the n+ source regions, 514 and 516, the n+ drain region 518, and the p+ bias diffusion region 548, additional insulating and metallization layers (not shown) are formed, masked and etched, for example, to provide electrical contacts to the various source, drain, gate, and bias diffusion regions of the CMOS structure 510. The resulting metal contacts of these steps are simplistically shown, for illustrative purposes, for example, as contacts 538, 540, 542, 544, 546, and 550 in FIG. 7B.

Referring back now to FIG. 7B, certain features of the CMOS structure 510 are now pointed out to explain how the method described in reference to FIGS. 8A–8D solves or alleviates the aforedescribed alignment problems. As described in reference to FIG. 8C, the alignment problem between each gate electrode and its respective threshold adjust regions results from one of the gate electrode's threshold adjust regions extending further than half way beneath the gate electrode, and the other of the gate electrode's threshold adjust regions extending less than half way beneath the gate electrode. For example, referring to FIG. 7B, gate electrode 528 has been formed with respect to the threshold adjust regions, 520 and 522, such that p type threshold adjust region 520 extends to a length Lgs1 from an edge adjacent to the p type threshold adjust region 520 towards an opposite edge of the gate electrode 528, and x type threshold adjust region 522 extends to a length Ldg1 from an edge adjacent to the x type threshold adjust region 522 towards an opposite edge of the gate electrode 528, wherein the length Ldg1>Lgs1.

Since the current flowing through a region is inversely related to the length of the region, the n-mos FET corresponding to the p type threshold adjust region 520 (e.g., 202 in FIG. 4A) will sink more current than the n-mos FET corresponding to the "ideal" p type threshold adjust region 224 of FIG. 4B (e.g., 202 in FIG. 4A), and the n-mos FET corresponding to the p type threshold adjust region 526 (e.g., 202 in FIG. 4A) will sink less current than the n-mos FET corresponding to the "ideal" p type threshold adjust region 224 of FIG. 4B (e.g., 202 in FIG. 4A). Consequently, if p type threshold adjust region 520 corresponds, for example, to n-mos FET pair 402 and in particular, to the n-mos FET of pair 402 which corresponds to n-mos FET 202 of cascode transconductance circuit 200, and if p type threshold adjust region 526 corresponds, for example, to n-mos FET pair 404 and in particular, to the n-mos FET of pair 404 which corresponds to n-mos FET 202 of cascode transconductance circuit 200, then the slope of Vin vs. Iout (i.e., the transconductance) corresponding to pair 402 will be steeper or larger than that of the "ideal" cascode transconductance circuit 200 as implemented by CMOS structure 210, and the slope of Vin vs. Iout (i.e., the transconductance) corresponding to pair 404 will be less steep or smaller than that of the "ideal" cascode transconductance circuit 200 as implemented by CMOS structure 210.

Similar to the CMOS structure 310, a key aspect of the present invention, is the symmetric design of the CMOS structure 510. In particular, the gate electrode 530 has been formed with respect to the threshold adjust regions, 526 and 522 (whose portion extending under gate 530 is referenced as 524), such that threshold adjust region 526 extends to a length Lgs2 from an edge of the gate electrode 530 adjacent to the threshold adjust region 526 towards an opposite edge of the gate electrode 530, and threshold adjust region 524 extends to a length Ldg2 from an edge of the gate electrode 530 adjacent to the threshold adjust region 524 towards an opposite edge of the gate electrode 530, wherein Lgs2>Ldg2. Conversely, the gate electrode 528 has been formed with respect to the threshold adjust regions, 520 and 522, such that threshold adjust region 520 extends to a length Lgs1 from an edge of the gate electrode 528 adjacent to the threshold adjust region 520 towards an opposite edge of the gate electrode 528, and threshold adjust region 522 extends to a length Ldg1 from an edge of the gate electrode 528 adjacent to the threshold adjust region 522 towards an opposite edge of the gate electrode 528, wherein Ldg1>Lgs1.

Accordingly, even though each of the lengths Lgs1, Ldg1, Ldg2, and Lgs2 is either less than or greater than the "ideal" length, which is exactly one half of the distance between opposing edges of each gate electrode, the average length of the threshold adjust regions corresponding to the gate-to-source regions (i.e., the average of Lgs1 and Lgs2) is equal to the "ideal" length, and the average length of the threshold adjust regions corresponding to the gate-to-drain regions (i.e., the average of Ldg1 and Ldg2) is equal to the "ideal" length. Consequently, even though the output current flowing through pair 402 may be larger than the ideal output current Iout of the cascode transconductance circuit 200, and the output current flowing through pair 404 may be smaller than the ideal output current Iout of the cascode transconductance circuit 200, the average current flowing through both pairs 402 and 404 is equal to the ideal output current Iout and consequently, the combined output current Iout' for the CMOS structure 510 is equal to 2*Iout, as in the "ideal" case.

Figure 9:
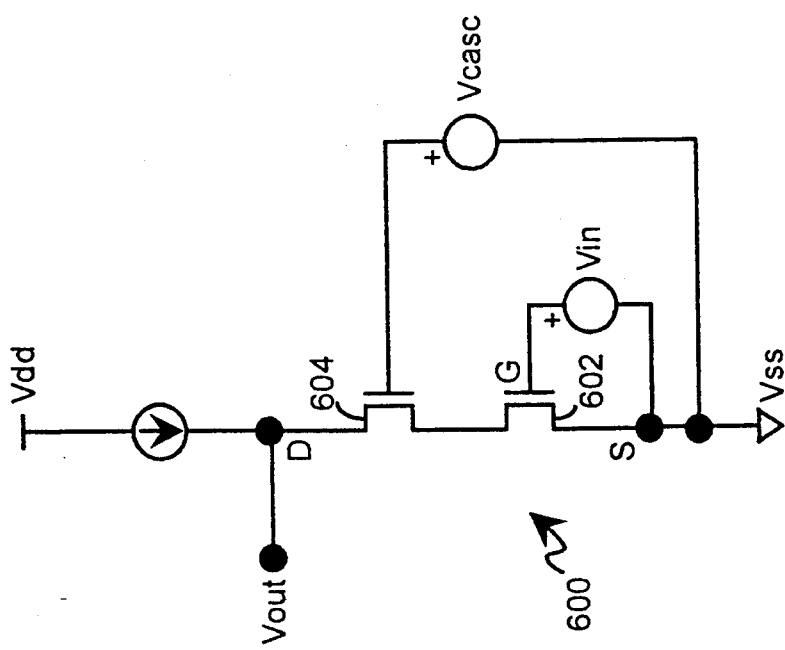
FIG. 9 illustrates a circuit used for simulating the frequency response of a conventional cascode amplifier.

FIG. 9 illustrates a circuit 600 used for simulating the frequency response for a conventional cascode amplifier circuit such as that described in reference to FIG. 1A. The conventional cascode amplifier circuit includes a current sinking n-mos FET 602 having a source connected to ground and a gate connected to an input voltage Vin, and a cascoding n-mos FET 604 having a source connected to a drain of the current sinking n-mos FET 602 and a gate connected to a biasing voltage Vcasc. The input voltage Vin is selected such that the resulting voltage Vgs being applied across the gate and source of the n-mos FET 602 is greater than a threshold voltage VT associated with the n-mos FET 602, and the biasing voltage Vcasc is selected such that both n-mos FETs 602 and 604 are ensured to operate in their saturated regions.

Figure 10:
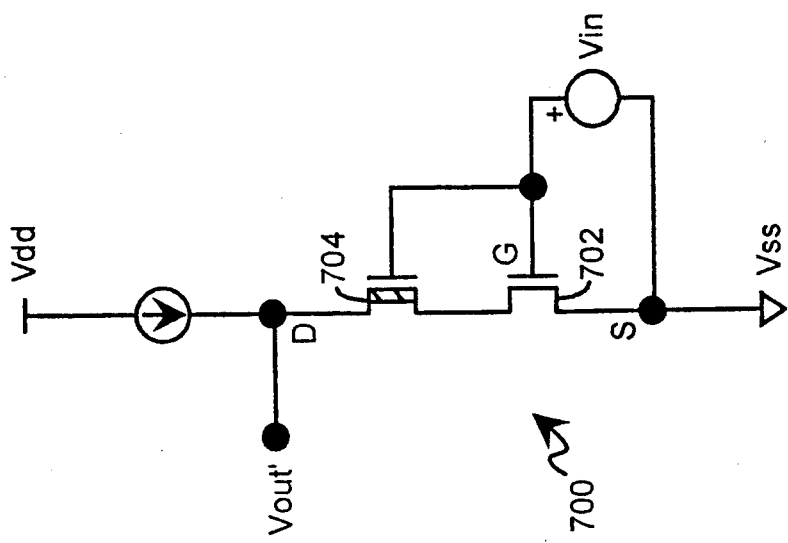
FIG. 10 illustrates a circuit used for simulating the frequency response of a self-cascoding amplifier utilizing aspects of the present invention.

FIG. 10 illustrates, on the other hand, a circuit 700 used for simulating the frequency response for a self-cascoding amplifier circuit utilizing aspects of the present invention such as that described in reference to FIG. 4A. The self-cascoding amplifier circuit includes a current sinking n-mos FET 702 having a source connected to ground and a gate connected to an input voltage Vin, and a cascoding n-mos FET 704 having a source connected to a drain of the current sinking n-mos FET 702. A gate of the cascoding n-mos FET 704 is connected to the gate of the current sinking n-mos FET 702, instead of a separate biasing voltage Vcasc like cascode amplifiers of the prior art. Hence, the amplifier circuit is called self-cascoding.

Figure 11:
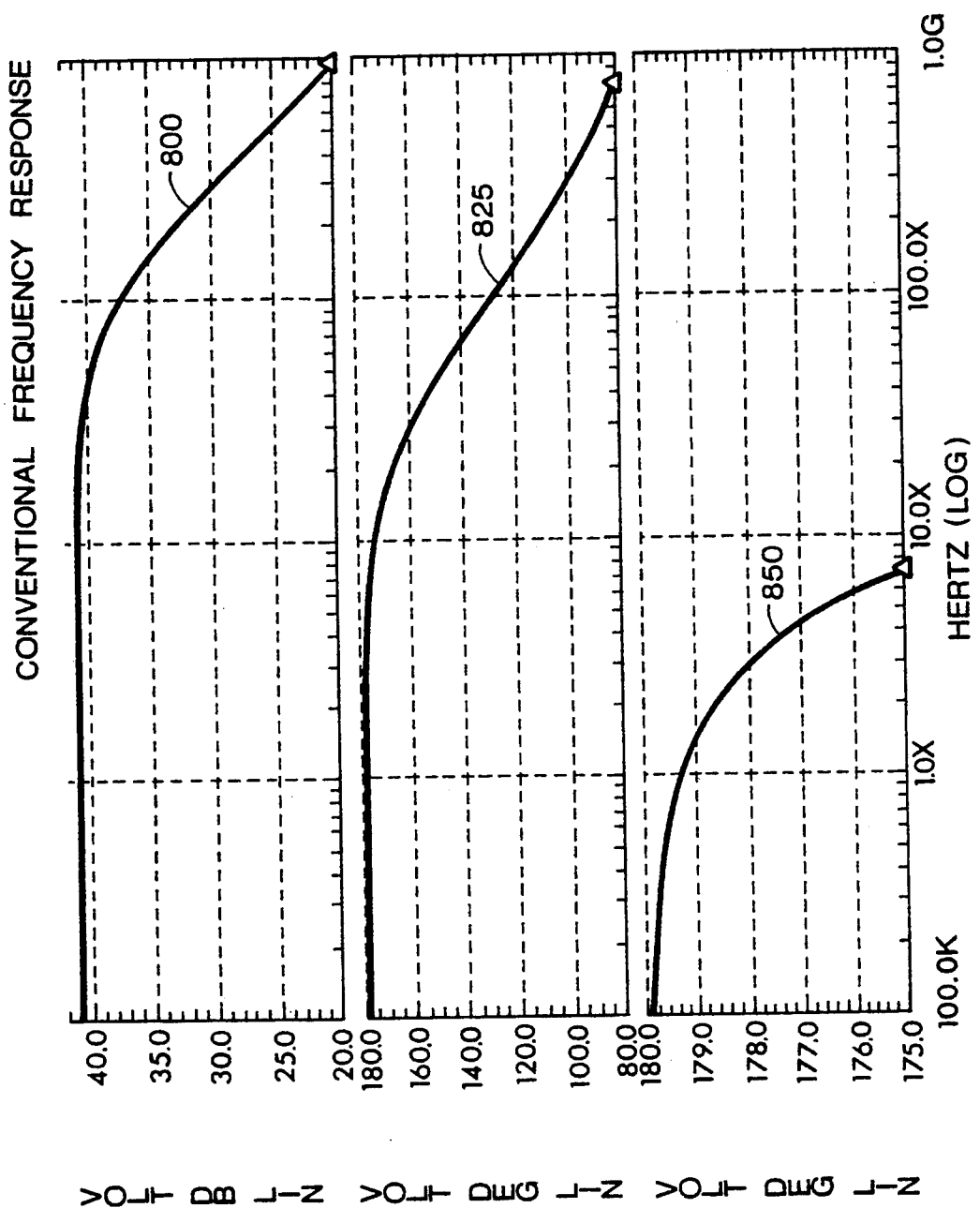
FIG. 11 illustrates simulated frequency and phase responses resulting from the conventional cascode amplifier circuit of FIG. 9.
Figure 12:
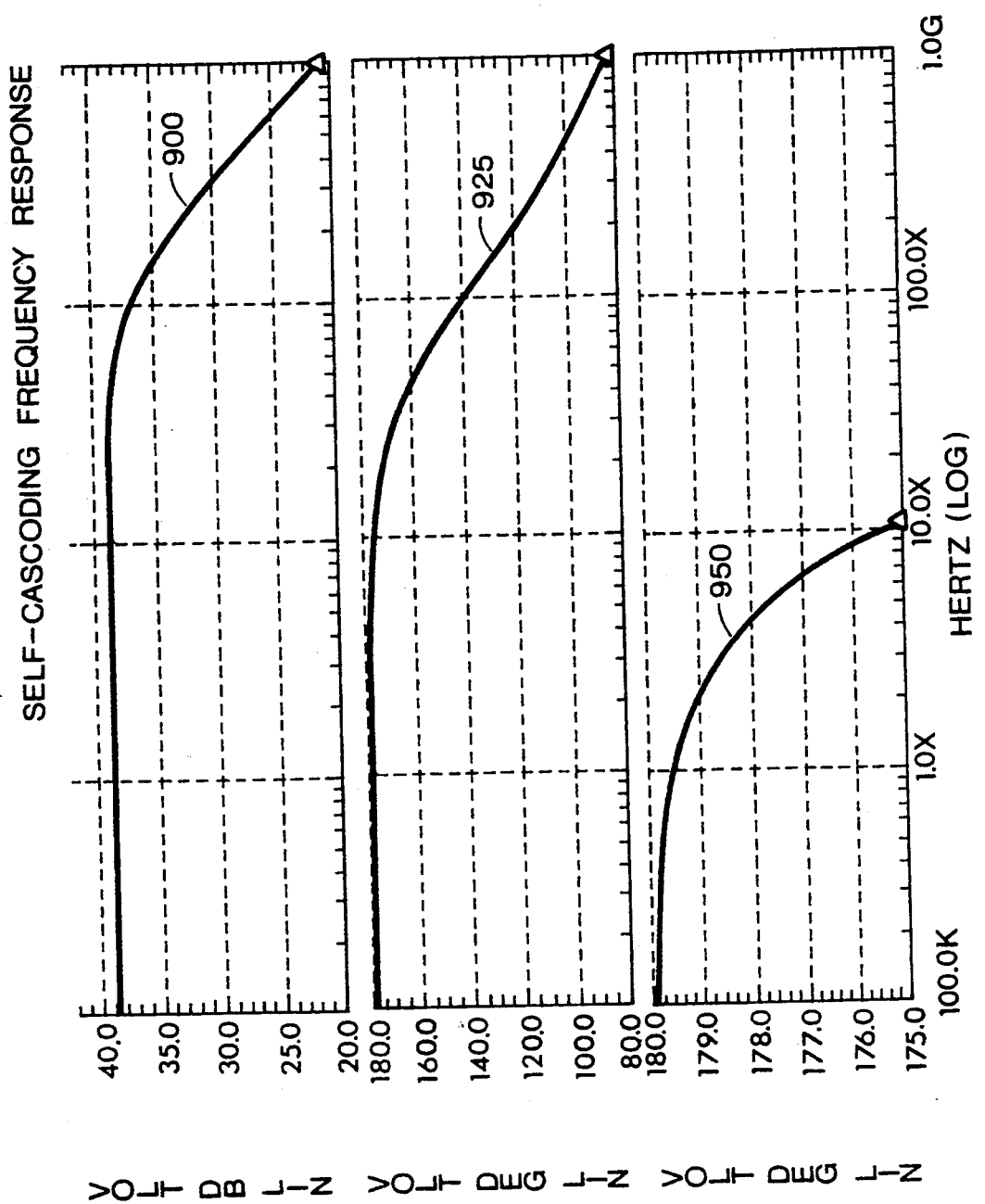
FIG. 12 illustrates simulated frequency and phase responses resulting from the self-cascoding amplifier circuit of FIG. 10, utilizing aspects of the present invention.

FIGS. 11 and 12 illustrate, as examples, simulated frequency and phase responses resulting from the conventional cascode amplifier circuit of FIG. 9, and the self-cascoding amplifier circuit of FIG. 10, respectively. In particular, FIG. 11 illustrates a frequency response 800, a phase response 825, and an amplified phase response 850 for the simulated conventional cascode amplifier circuit, and FIG. 12 illustrates a frequency response 900, a phase response 925, and an amplified phase response 950 for the self-cascoding cascode amplifier circuit of the present invention. In comparing both the frequency and phase responses of the conventional vs. the self-cascoding amplifier circuit, the simulated self-cascoding amplifier circuit, utilizing aspects of the present invention, shows a larger bandwidth (approximately 50% larger) than that of the simulated conventional cascode amplifier circuit.

Although the various aspects of the present invention have been described with respect to a preferred embodiment, it will be understood that the invention is entitled to the full protection within the full scope of the appended claims.

What is claimed is:

1. A cascode transconductance circuit comprising:
   a first n-mos FET having a first gate, a first drain, a first source, and a first threshold voltage, said first source connected to a first voltage; and
   a second n-mos FET having a second gate, a second drain, a second source, and a second threshold voltage, said second gate connected to said first gate of said first n-mos FET, said second drain connected to a second voltage greater than said first voltage, said second source connected to said first drain of said first n-mos FET, and said first threshold voltage being at least 0.1 volts greater than said second threshold voltage to ensure that said first n-mos FET operates in its saturated region;
   wherein an input voltage applied to said connected together first and second gates of said first and second n-mos FETs, respectively, causes a proportional output current in response thereof at said second drain of said second n-mos FET.

2. The cascode transconductance circuit as recited in claim 1, wherein said first threshold voltage of said first n-mos FET is in a range of 0.6 to 1.1 volts.

3. The cascode transconductance circuit as recited in claim 1, wherein said second threshold voltage of said second n-mos FET is in a range of −0.2 to 0.2 volts.

4. The cascode transconductance circuit as recited in claim 1, further comprising:
   a third n-mos FET having a third gate, a third drain, a third source, and a third threshold voltage, said third gate connected to said connected together first and second gates of said first and second n-mos FETs, respectively, and said third source connected to said first voltage; and
   a fourth n-mos FET having a fourth gate, a fourth drain, a fourth source, and a fourth threshold voltage, said fourth gate connected to said connected together first, second and third gates of said first, second and third n-mos FETs, respectively, said fourth drain connected to said second voltage, said fourth source connected to said third drain of said third n-mos FET, and said third threshold voltage being at least 0.1 volts greater than said fourth threshold voltage to ensure that said third n-mos FET operates in its saturated region;
   wherein an input voltage applied to said connected together gates of said first, second, third, and fourth n-mos FETs causes a proportional output current in response thereof at said connected together second and fourth drains of said second and fourth n-mos FETs, respectively.

5. The cascode transconductance circuit as recited in claim 4, wherein said first and third threshold voltages of said first and third n-mos FETs, respectively, are in a range of 0.6 to 1.1 volts.

6. The cascode transconductance circuit as recited in claim 4, wherein said second and fourth threshold voltages of said second and fourth n-mos FETs, respectively, are in a range of −0.2 to 0.2 volts.

7. A cascode transconductance circuit comprising:
   a first p-mos FET having a first gate, a first source, a first drain, and a first threshold voltage, said first drain connected to a first voltage; and
   a second p-mos FET having a second gate, a second drain, a second source, and a second threshold voltage, said second gate connected to said first gate of said first p-mos FET, said second source connected to a second voltage greater than said first voltage, said second drain connected to said first source of said first p-mos FET, and said second threshold voltage being at least 0.1 volts greater than said first threshold voltage to ensure that said second p-mos FET operates in its saturated region;
   wherein an input voltage applied to said connected together first and second gates of said first and second p-mos FETs, respectively, causes a proportional output current in response thereof at said second source of said second p-mos FET.

8. The cascode transconductance circuit as recited in claim 7, wherein said first threshold voltage of said first p-mos FET is in a range of −0.2 to 0.2 volts.

9. The cascode transconductance circuit as recited in claim 7, wherein said second threshold voltage of said second p-mos FET is in a range of −0.6 to −1.1 volts.

10. The cascode transconductance circuit as recited in claim 7, further comprising:
   a third p-mos FET having a third gate, a third source, a third drain, and a third threshold voltage, said third gate connected to said connected together first and second gates of said first and second p-mos FETs, respectively, said third drain connected to said first voltage; and
   a fourth p-mos FET having a fourth gate, a fourth source, a fourth drain, and a fourth threshold voltage, said fourth gate connected to said connected together first, second and third gates of said first, second and third p-mos FETs, respectively, said fourth source connected to said second voltage, said fourth drain connected to said third source of said third p-mos FET, and said fourth threshold voltage being at least 0.1 volts greater than said third threshold voltage to ensure that said fourth p-mos FET operates in its saturated region;
   wherein an input voltage applied to said connected together first, second, third, and fourth gates of said first, second, third, and fourth p-mos FETs, respectively, causes a proportional output current in response thereof at said connected together second and fourth sources of said second and fourth p-mos FETs, respectively.

11. The cascode transconductance circuit as recited in claim 10, wherein said first and third threshold voltages of said first and third p-mos FETs, respectively, are in a range of −0.2 to 0.2 volts.

12. The cascode transconductance circuit as recited in claim 10, wherein said second and fourth threshold voltages of said second and fourth p-mos FETs, respectively, are in a range of −0.6 to −1.1 volts.

13. A cascode transconductance circuit constructed in a p− type substrate or well, comprising:
   a first gate electrode formed on a gate oxide layer over a surface of said p− type substrate or well;
   an n+ type drain region formed beneath said surface of said p− type substrate or well, and laterally extending towards a second edge from a first edge of said first gate electrode such that said n+ type drain region lies partially beneath said first gate electrode;
   a first n+ type source region formed beneath said surface of said p− type substrate or well, and laterally extending towards said first edge from said second edge of said first gate electrode such that said first n+ type source region lies partially beneath said first gate electrode;
   a first p type threshold adjust region formed adjacent to said first n+ type source region, and laterally extending from said first n+ type source region to a first point lying beneath said first gate electrode, said first point being at a first distance greater than zero from said first edge of said first gate electrode and a second distance greater than zero from said second edge of said first gate electrode; and
   a first region laterally extending from said n+ type drain region to said first p type threshold adjust region, wherein a first threshold voltage associated with said first gate electrode and said first p type threshold adjust region is at least 0.1 volts greater than a second threshold voltage associated with said first gate electrode and said first region.

14. The cascode transconductance circuit as recited in claim 13, wherein said first and second distances are substantially equal.

15. The cascode transconductance circuit as recited in claim 13, wherein said first p type threshold adjust region has a concentration of p type dopants sufficient to cause said first threshold voltage associated with said first gate electrode and said first p type threshold adjust region to be in a range of 0.6 to 1.1 volts.

16. The cascode transconductance circuit as recited in claim 13, wherein said first region is formed of a first portion of said p− type substrate or well, lying beneath said first gate electrode and extending laterally between said n+ type drain region and said first p type threshold adjust region, and has a concentration of p type dopants sufficient to cause a threshold voltage associated with said first gate electrode and said first portion of said p− type substrate or well, to be in a range of −0.2 to 0.2 volts.

17. The cascode transconductance circuit as recited in claim 13, wherein said first region is formed of a second p type threshold adjust region formed beneath said first gate electrode and extending laterally between said n+ type drain region and said first p type threshold adjust region, wherein said first and second p type threshold adjust regions have a first and second concentration of p type dopants, respectively, such that said first threshold voltage associated with said first gate electrode and said first p type threshold adjust region, is at least 0.1 volts greater than said second threshold voltage associated with said first gate electrode and said second p-type threshold adjust region.

18. The cascode transconductance circuit as recited in claim-13, wherein said first region is formed of a first n type threshold adjust region formed beneath said first gate electrode and extending laterally between said n+ type drain region and said first p type threshold adjust region, wherein said first p type threshold adjust region has a first concentration of p type dopants and said first n type threshold adjust region has a first concentration of n type dopants, and said first threshold voltage associated with said first gate electrode and said first p type threshold adjust region, is at least 0.1 volts greater than said second threshold voltage associated with said first gate electrode and said first n type threshold adjust region.

19. The cascode transconductance circuit as recited in claim 13, further comprising:
   a second gate electrode formed on a gate oxide layer over said surface of said p− type substrate, wherein said n+ type drain region laterally extends towards a second edge from a first edge of said second gate electrode such that said n+ type drain region lies partially beneath said second gate electrode;
   a second n+ type source region formed beneath said surface of said p− type substrate or well, and laterally extending towards said first edge front said second edge of said second gate electrode such that said second n+ type source region lies partially beneath said second gate electrode;
   a second p type threshold adjust region formed adjacent to said second n+ type source region, and laterally extending from said second n+ type source region to a second point lying beneath said second gate electrode, said second point being at a third distance from first edge of said second gate electrode and a fourth distance from said second edge of said second gate electrode; and a second region laterally extending from said n+ type drain region to said second p type threshold adjust region, wherein a third threshold voltage associated with said second gate electrode and said second p type threshold adjust region is at least 0.1 volts greater than a fourth threshold voltage associated with said second gate electrode and said second region.

20. The cascode transconductance circuit as recited in claim 19, wherein said first, second, third, and fourth distances are substantially equal.

21. The cascode transconductance circuit as recited in claim 19, wherein said first, second, third, and fourth distances are not substantially equal, but a sum of said first and third distances is substantially equal to a sum of said second and fourth distances.

22. The cascode transconductance circuit as recited in claim 19, wherein said first and second p type threshold adjust regions each has a concentration of p type dopants sufficient to cause said first threshold voltage associated with said first gate electrode and said first p type threshold adjust region, and said third threshold voltage associated with said second gate electrode and said second p type threshold adjust region to each be in a range of 0.6 to 1.1 volts.

23. The cascode transconductance circuit as recited in claim 19, wherein said first region is formed of a first portion of said p— type substrate or well, lying beneath said first gate electrode and extending laterally between said n+ type drain region and said first p type threshold adjust region, and said second region is formed of a second portion of said p— type substrate or well, lying beneath said second gate electrode and extending laterally between said n+ type drain region and said second p type threshold adjust region, each of said first and second portions of said p— type substrate or well having a concentration of p type dopants sufficient to cause said second threshold voltage associated with said first gate electrode and said first portion of said p— type substrate or well, and said fourth threshold voltage associated with said second gate electrode and said second portion of said p— type substrate or well to each be in a range of −0.2 to 0.2 volts.

24. The cascode transconductance circuit as recited in claim 19, wherein said first region is formed of
a third p type threshold adjust region lying beneath said first gate electrode and extending laterally between said n+ type drain region and said first p type threshold adjust region, and said second region is formed of
a fourth p type threshold adjust region lying beneath said second gate electrode and extending laterally between said n+ type drain region and said second p type threshold adjust region.

25. The cascode transconductance circuit as recited in claim 19, wherein said first region is formed of
a first n type threshold adjust region lying beneath said first gate electrode and extending laterally between said n+ type drain region and said first p type threshold adjust region, and said second region is formed of a second n type threshold adjust region lying beneath said second gate electrode and extending laterally between said n+ type drain region and said second p type threshold adjust region.

26. A cascode transconductance circuit constructed in an n— type substrate or well, comprising:
a first gate electrode formed on a gate oxide layer over a surface of said n— type substrate or well;
a first p+ type source region formed beneath said surface of said n— type substrate or well, and laterally extending towards a second edge from a first edge of said first gate electrode such that said first p+ type source region lies partially beneath said first gate electrode;
a p+ type drain region formed beneath said surface of said n— type substrate or well, and laterally extending towards said first edge from said second edge of said first gate electrode such that said p+ type drain region lies partially beneath said first gate electrode;
a first p type threshold adjust region having a first concentration of p type dopants and formed adjacent to said first p+ type source region, and laterally extending from said p+ type source region to a first point lying beneath said first gate electrode, said first point being at a first distance greater than zero from said second edge of said first gate electrode and a second distance greater than zero from said first edge of said first gate electrode; and
a second p type threshold adjust region having a second concentration of p type dopants and formed adjacent to said p+ type drain region, and laterally extending from said p+ type drain region to said first point lying beneath said first gate electrode, wherein said first and second concentrations of p type dopants are such that a second threshold voltage associated with said first gate electrode and said second p type threshold adjust region, is at least 0.1 volts greater than a first threshold voltage associated with said first gate electrode and said first p type threshold adjust region.

27. The cascode transconductance circuit as recited in claim 26, wherein said first and second distances are substantially equal.

28. The cascode transconductance circuit as recited in claim 26, wherein said first concentration of p type dopants is sufficient to cause said first threshold voltage associated with said first gate electrode and said first p type threshold adjust region to be in a range of −0.6 to −1.1 volts.

29. The cascode transconductance circuit as recited in claim 26, wherein said second concentration of p type dopants is sufficient to cause said second threshold voltage associated with said first gate electrode and said second p type threshold adjust region to be in a range of −0.2 to 0.2 volts.

30. The cascode transconductance circuit as recited in claim 26, further comprising:
a second gate electrode formed on a gate oxide layer over said surface of said n— type substrate, wherein said p+ type drain region laterally extends towards a second edge from a first edge of said second gate electrode such that said p+ type drain region lies partially beneath said second gate electrode;
a second p+ type source region formed beneath said surface of said p— type substrate or well, and laterally extending towards said first edge from said second edge of said second gate electrode such that said second p+ type source region lies partially beneath said second gate electrode;

a third p type threshold adjust region having a third concentration of p type dopants equal to said second concentration of p type dopants and formed adjacent to said p+ type drain region, and laterally extending from said p+ type drain region to a second point lying beneath said second gate electrode, said second point being at a third distance from said first edge of said second gate electrode and a fourth distance from said second edge of said second gate electrode; and a fourth p type threshold adjust region having a fourth concentration of p type dopants equal to said first concentration of p type dopants and formed adjacent to said second p+ type source region, and laterally extending from said second p+ type source region to said second point lying beneath said second gate electrode, wherein said third and fourth concentrations of p type dopants are such that a fourth threshold voltage associated with said second gate electrode and said fourth p type threshold adjust region, is at least 0.1 volts greater than a third threshold voltage associated with said second gate electrode and said third p type threshold adjust region.

31. The cascode transconductance circuit as recited in claim 30, wherein said first, second, third, and fourth distances are substantially equal.

32. The cascode transconductance circuit as recited in claim 30, wherein said first, second, third, and fourth distances are not substantially equal, but a sum of said first and third distances is substantially equal to a sum of said second and fourth distances.

33. The cascode transconductance circuit as recited in claim 30, wherein said first and fourth concentrations of p type dopants are sufficient to cause said first threshold voltage associated with said first gate electrode and said first p type threshold adjust region, and said fourth threshold voltage associated with said second gate electrode and said fourth p type threshold adjust region to each be in a range of $-0.6$ to $-1.1$ volts.

34. The cascode transconductance circuit as recited in claim 30, wherein said second and third concentrations of p type dopants are sufficient to cause said second threshold voltage associated with said first gate electrode and said second p type threshold adjust region, and said third threshold voltage associated with said second gate electrode and said third p type threshold adjust region to each be in a range of $-0.2$ to $0.2$ volts.

* * * * *

UNITED STATES PATENT AND TRADEMARK OFFICE
CERTIFICATE OF CORRECTION

PATENT NO. : 5,401,987
DATED : March 28, 1995
INVENTOR(S) : Hiser et al.

It is certified that error appears in the above-indentified patent and that said Letters Patent is hereby corrected as shown below:

In Column 20, line 63 in Claim 19
   Replace "ally extending towards said first edge front said" with:

--ally extending towards said first edge from said--

Signed and Sealed this

Fifth Day of December, 1995

Attest:

BRUCE LEHMAN

Attesting Officer

Commissioner of Patents and Trademarks